(12) United States Patent
Mohri et al.

(10) Patent No.: US 7,358,445 B1
(45) Date of Patent: Apr. 15, 2008

(54) CIRCUIT SUBSTRATE AND APPARATUS INCLUDING THE CIRCUIT SUBSTRATE

(75) Inventors: Noboru Mohri, Osaka (JP); Hayami Matsunaga, Osaka (JP); Masaaki Hayama, Nara (JP); Tomitarou Murakami, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 989 days.

(21) Appl. No.: 09/661,281

(22) Filed: Sep. 14, 2000

Related U.S. Application Data

(62) Division of application No. 09/041,666, filed on Mar. 13, 1998, now Pat. No. 6,132,543.

(30) Foreign Application Priority Data

Mar. 14, 1997  (JP)  ................... 9-060656

(51) Int. Cl.
   *H05K 1/03*       (2006.01)
(52) U.S. Cl. .............. 174/255; 174/260; 174/262
(58) Field of Classification Search ................ 174/255, 174/266, 264, 267, 262, 256, 257, 259; 428/210
   See application file for complete search history.

(56) References Cited

U.S. PATENT DOCUMENTS

| | | | |
|---|---|---|---|
| 3,701,317 A | | 10/1972 | Miyamoto et al. |
| 4,700,473 A | * | 10/1987 | Freyman et al. ............... 29/846 |
| 4,715,117 A | * | 12/1987 | Enomoto ..................... 29/851 |
| 4,806,334 A | * | 2/1989 | Fujinaka et al. ............. 428/631 |
| 4,830,264 A | * | 5/1989 | Bitaillou et al. ....... 228/180.21 |
| 4,914,814 A | | 4/1990 | Behun et al. |
| 5,127,330 A | | 7/1992 | Okazaki et al. |
| 5,436,203 A | | 7/1995 | Lin |
| 5,519,177 A | * | 5/1996 | Wang et al. ................. 174/259 |
| 5,542,174 A | | 8/1996 | Chiu |
| 5,557,844 A | * | 9/1996 | Bhatt et al. ..................... 29/852 |
| 5,589,255 A | * | 12/1996 | Enomoto et al. ............ 442/149 |
| 5,591,941 A | | 1/1997 | Acocella et al. |
| 5,609,704 A | | 3/1997 | Hayama et al. |
| 5,646,368 A | * | 7/1997 | Muyshondt et al. ........... 174/33 |
| 5,658,827 A | | 8/1997 | Aulicino et al. |
| 5,672,848 A | * | 9/1997 | Komorita et al. ............ 174/260 |
| 5,689,091 A | * | 11/1997 | Hamzehdoost et al. ...... 174/255 |
| 5,717,245 A | | 2/1998 | Pedder |
| 5,718,367 A | | 2/1998 | Covell, II et al. |

(Continued)

FOREIGN PATENT DOCUMENTS

JP       07202381       4/1995

(Continued)

*Primary Examiner*—Ishwar (I. B.) Patel
(74) *Attorney, Agent, or Firm*—McDermott Will & Emery LLP

(57) ABSTRACT

The present invention provides a circuit substrate which has a substrate including a first surface and a second surface opposite to the first surface. A first and a second conductor patterns are formed on the first and the second surface respectively. The second surface has larger surface roughness than the first surface. When the circuit substrate is mounted on another substrate, it is mounted to the other substrate via the second surface. The circuit substrate is capable of mounting a device or being mounted on another substrate to form an apparatus.

9 Claims, 9 Drawing Sheets

U.S. PATENT DOCUMENTS

| | | | |
|---|---|---|---|
| 5,763,059 A | * | 6/1998 | Yamaguchi et al. ........ 428/209 |
| 5,763,947 A | | 6/1998 | Bartley |
| 5,783,866 A | | 7/1998 | Lee et al. |
| 5,796,589 A | | 8/1998 | Barrow |
| 5,838,545 A | | 11/1998 | Clocher et al. |
| 5,886,876 A | * | 3/1999 | Yamaguchi ................. 361/767 |
| 5,889,322 A | | 3/1999 | Hamada et al. |
| 5,907,187 A | | 5/1999 | Koiwa et al. |
| 5,934,545 A | | 8/1999 | Gordon |
| 5,943,212 A | * | 8/1999 | Horiuchi et al. ............ 361/704 |

FOREIGN PATENT DOCUMENTS

| | | |
|---|---|---|
| JP | 08088297 | 2/1996 |

\* cited by examiner

CIRCUIT SUBSTRATE AND APPARATUS INCLUDING THE CIRCUIT SUBSTRATE

This application is a Divisional of application Ser. No. 09/041,666 filed Mar. 13, 1998 now U.S. Pat. No. 6,132,543.

FIELD OF THE INVENTION

The present invention relates to packaging substrates on which semiconductors are to be mounted and the method of manufacturing.

BACKGROUND OF THE INVENTION

In association with the progressive size reduction of electronic equipment in recent years, the electronic components used in such electronic equipment continue to be further reduced in size as well. The same pattern can be witnessed with semiconductor packages, where the ball-grid array (BGA) is drawing attention because of its small size and ease of mounting advantage over other packages coping with a large increase in number of terminal pins.

Among the BGA type packages, those using ceramic substrate are superior in their ease of face-down mounting and heat dissipation characteristics, and are thus most suitable for further miniaturization of packages especially for LSI's which dissipate a large quantity of heat due to high speed signal transmission in devices such as microprocessors.

As disclosed in Japanese Laid-Open Patent Hei 8-88297, a ceramic type BGA package (C-BGA) is composed of a ceramic multi layer wiring substrate joined with solder balls. FIG. 18 shows a conventional packaging substrate. In FIG. 18, C-BGA package 101 is composed of a multi layer ceramic circuit substrate 102 joined with two or more types of solder balls 106 with different melting points for connection.

In this example of a conventional packaging substrate, when experiencing thermal hysteresis resulting from environmental changes, stress and strain are caused in the solder balls due to the difference in thermal expansion between the ceramic package and printed circuit board. The use of two or more types of solder balls is to solve the problem of low reliability of connection such as breakage of connecting parts owing to thermal fatigue resulting from stress or strain, or breakage of the ceramic package itself due to stress.

In order to make a multilayer ceramic circuit substrate 102 in this method, it is necessary to prepare several pieces of green sheets composed mainly of alumina as the base material; form via holes on each of the sheets; form a wiring pattern; and fill the via holes with a conductive paste. A ceramic multi layer circuit substrate 102 is obtained by integrating each green sheet on which the wiring pattern has been formed through the laminating, heating and pressurizing processes.

As another conventional example, a method of manufacturing a ceramic packaging substrate in which fine wiring is formed on a ceramic substrate is disclosed in Japanese Laid-Open Patent Hei 7-202381. As the process is shown in FIG. 19, a conductive layer 202 is formed by printing on the entire surface of a ceramic substrate 201, followed by forming an anti-sandblast resin pattern 203 on that part of the surface of the conductive layer where a conductor pattern is to be formed by a photo-lithography process, and forming a conductor pattern 204 by peeling off the anti-sandblast resin pattern after removing by sand-blasting processing the portion of the conductive layer where the aforesaid anti-sandblast resin pattern has not been formed. In this method, blotting of the conductor pattern, which usually occurs with screen printing method, does not occur. Also, there is no dispersion of the height of the conductor pattern depending on locations and the flatness of the top portions of the pattern obtained is superior.

However, the conventional example described first has the following problems.

1) Since the formation of a wiring pattern is made by screen printing, it is extremely difficult to simultaneously make both the line width (W) and the line spacing (S) smaller than 75 μm.

2) When forming a wiring pattern by screen printing, the finer the pattern the thinner the film becomes. As an example, when W=75 μm, the film thickness obtained will be only 5 μm resulting in a high wiring resistance.

3) Especially when tungsten is used as the wiring material, the wiring resistance will be 3 to 5 times higher than that of silver and copper. As the pattern gets finer, this disadvantage becomes more conspicuous, in some cases making the use as electronic components impractical.

4) As the substrate and wiring material are simultaneously fired at such high temperatures as approximately 900 to 1,600° C., material shrinkage of approximately 15-20% occurs after the firing, thereby causing a large dispersion in the dimensions of the substrate. The dispersion of shrinkage causes a large dispersion in the dimension of the wiring, leading to inaccuracy of connection with the very fine bumps of a LSI and to a lowered yield of packaging.

5) Furthermore, in the case of forming of wiring pattern by screen printing, the line width becomes wider than 75 μm (generally 120 μm or greater is necessary when yield of printing and wiring resistance are taken into account). In order to form many lines in a narrow area, it is necessary to adopt a multi layer configuration of wiring, and as the number of layers increases and the dimensional precision becomes tighter to secure precision in mounting, the cost of the substrate increases.

On the other hand, the second example of the conventional method has the following problems.

1) Since a conductive layer is individually formed by printing on the entire surface of a ceramic substrate and then that part of the conductive layer where the aforementioned anti-sandblast resin pattern is not formed is removed by sandblasting, loss of expensive conductor material is large which is problematic from the standpoint of effective usage of resources, productivity is low due to dependence on the time-consuming process of sandblasting, resulting in a cost increase in the packaging substrate.

2) Also, as the process of individually forming an anti-sandblast resin pattern on a ceramic substrate by the use of photolithography includes the processes of film formation, exposure, and developing, it has the disadvantage of low productivity even though the precision is high.

3) A wiring pattern can be finely formed by photolithography, however, with the sandblasting method of removing a conductive layer, a desired wiring pattern cannot be obtained unless the thickness of the conductive layer is made thinner as the wiring pattern is made finer. For example, when forming a wiring with a line width of W=30 μm, thickness of the conductive layer should be approximately 10 μm or smaller in order to obtain a desired line width. Consequently, this example, too, has the disadvantage of a high wiring resistance, making it inappropriate for most C-BGA's, especially for large-size C-BGA.

SUMMARY OF THE INVENTION

To solve these problems of the conventional methods and to provide a superior packaging substrate, the present invention of a method of manufacturing a packaging substrate, wherein a first conductor pattern is formed by intaglio printing on a circuit substrate and a first ball-shaped solder is joined to a second conductor pattern formed on the opposite side of said circuit substrate, comprises processes of:

(a) forming an intaglio on the surface of a flexible material by making a patterned groove corresponding to the first conductor pattern, (b) repeatedly filling and drying a conductive paste in the groove of said intaglio, (c) transferring the conductive paste pattern onto the circuit substrate by bonding the intaglio with said circuit substrate through applying heat and pressure, and then peeling off said intaglio from said circuit substrate, (d) firing said circuit substrate and said transferred conductive paste pattern.

The present invention of method of manufacturing a packaging substrate may further comprise (e) forming said second conductor pattern printed on the side of the circuit substrate opposite to said first conductor pattern, (f) connecting said second and first conductor patterns by means of a conductive material located in a through hole of the circuit substrate, and (g) joining the first ball-shaped solder to said second conductor pattern on the circuit substrate.

The present invention of method of manufacturing a packaging substrate may further comprise a process of disposing an adhesive layer disposed between said circuit substrate and said intaglio after the process of (b).

In the present invention, the circuit substrate may be formed in a multi layer wiring configuration. Also, a surface roughness of said circuit substrate may be made larger on a printing surface of the second conductor pattern than on a printing surface of the first conductor pattern.

Also, the method of manufacturing a packaging substrate of the present invention may comprise processes of forming a dielectric layer on top of a portion of the first conductor pattern or the second conductor pattern, and forming a third conductor pattern on top of said dielectric layer.

Also, the method of manufacturing a packaging substrate of the present invention may comprise processes of forming a thinner land portion of the first conductor pattern in a shallower groove of an intaglio comprising at least two depths of grooves, and electrically connecting an LSI chip having bumps through said bumps by face-down mounting on said thinner land portion of the first conductor.

Having the above processes, the present invention provides the following advantages.

1) The present invention makes it possible to form line width of a wiring pattern to as fine as 10 μm. If a packaging substrate allows a line width of 30 μm, the thickness of the conductor can be made as thick as 30 μm, thus lowering the wiring resistance and allowing essentially all the wiring on a single layer of wiring to perform even in the case of large-size multiple-terminal C-BGA.

2) Since the conductor pattern is formed on a ceramic substrate which has already been sintered, the present invention makes it possible to control the precision of the land pattern for connection with LSI, and approximately 100% yield of the face-down mounting of a LSI can be achieved. Also, as the land portion of conductor pattern can be made thin, displacement of a LSI while mounting can be minimized, thereby being able to further raise the yield of mounting even when LSI bump pitch gets smaller.

3) As the line width of a wiring pattern can be made as fine as 10 μm, in addition to the effect described in 1) above, further miniaturization becomes possible by employing a multilayer configuration which allows mounting of multiple LSI's.

4) As the surface roughness of the surface of the substrate on which solder balls are joined is large, bonding strength between the solder balls and conductor pattern and between conductor pattern and the substrate is large, and consequently mechanical strength and reliability of connection by the solder balls is high.

5) As the wiring pattern can be formed on a single layer, it is possible to eliminate noise components by a simple construction of covering the pattern with a dielectric layer thereby providing an electrically stable packaging substrate.

6) As the empty space in through holes of the substrate is filled with solder, bonding strength between the solder balls and the substrate is high, resulting in high mechanical strength reliability of solder balls. Also, as the thermal conductivity of the solder is high, heat generated in LSI can be efficiently transferred to the solder balls.

7) As a pillar-shaped solder can be formed with ease, it is easy to design a construction in which the stress and strain resulting from the difference of thermal expansion between the packaging substrate and printed circuit board can be relieved by the pillar-shaped solder there by enhancing the reliability of connection.

BRIEF DESCRIPTION OF THE DRAWING

FIG. 1 (*b*) is a partially enlarged cross section of the packaging substrate.

FIG. 10(*b*) is a partial cross section showing the process of making the height of the packaging substrate uniform after filling the second solder.

DESCRIPTION OF THE PREFERRED EMBODIMENT

First Embodiment

Figure 1A:
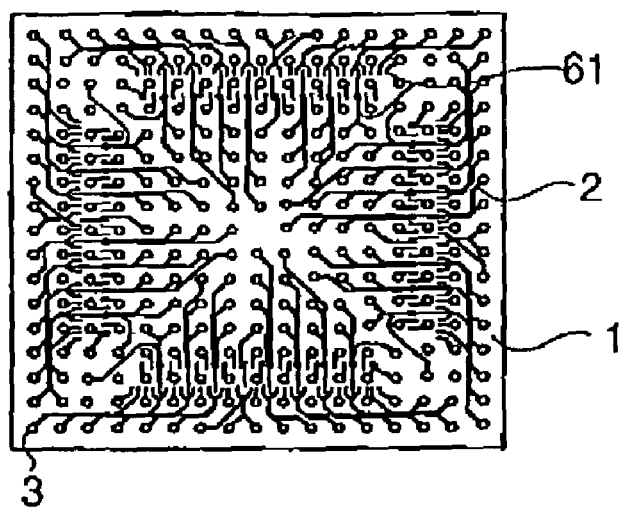
FIG. 1 (*a*) is a plan view of the wiring pattern of the packaging substrate in accordance with the first embodiment of the present invention.

The first embodiment of the method of manufacturing packaging substrate in accordance with the present invention will be explained as follows referring to FIGS. 1 to 5. FIG. 1(a) shows an example of a wiring pattern of this embodiment and FIG. 1(b) shows a partial cross section of the wiring pattern.

Figure 1B:
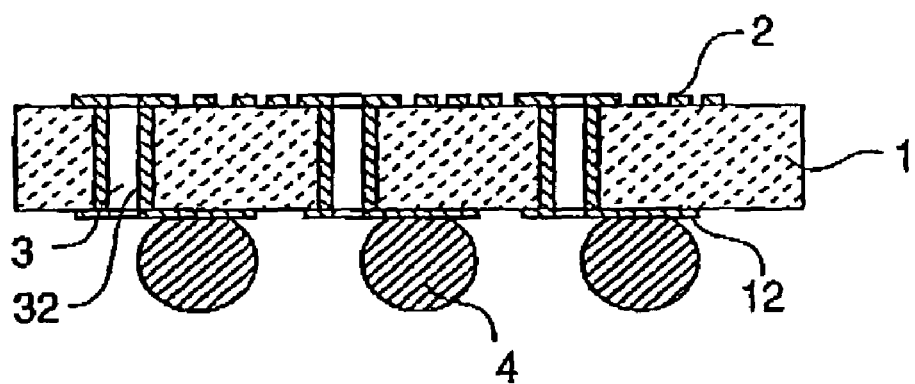

As shown in FIGS. 1(a) and 1(b), the packaging substrate of this embodiment has, for example, 289 input-output terminals in the form of ball-shaped solders with a spacing of 1.0 mm. FIG. 1(a) shows an example of the wiring pattern of a first conductor pattern 2, where the minimum line width of the conductor line is chosen to be 30 μm, the minimum inter-line spacing is 60 μm, and the conductor thickness after firing is 30 μm. The electrode of the first conductor pattern 2 has a land portion 61 at one end for connection with an LSI chip while another end leads to a through hole 3 of the circuit substrate 1 for connection with a second conductor pattern 12 via electrode 32 in the through hole 3 and for further connection with a first ball-shaped solder.

Figure 2:
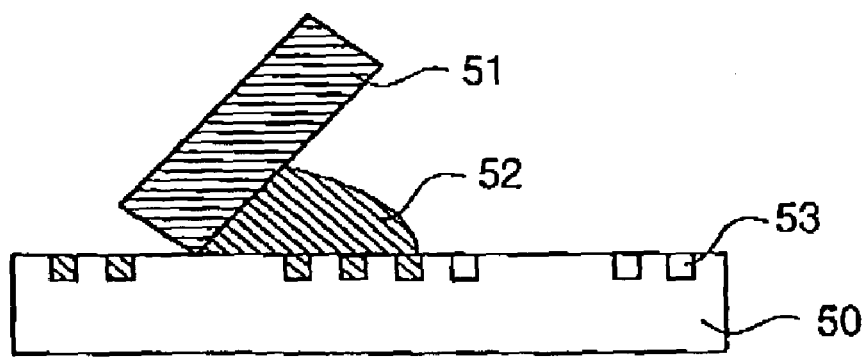
FIG. 2 is a schematic diagram showing the process of filling conductive paste onto an intaglio in the packaging substrate.

Next, manufacturing method of this embodiment will be explained in the sequence of the process. First, a first conductor pattern 2 is made by intaglio printing. In FIG. 2, an intaglio 50 to be used is made by irradiating a laser beam in an ultraviolet region of 248 nm wavelength on a 125 μm thick polyimide film of a flexible resin base material in a configuration corresponding to a desired wiring pattern using an excimer laser apparatus. The laser-irradiated portions are decomposed by photochemical reaction leaving a groove portion 53 corresponding to the wiring line of the first conductor pattern. In this embodiment, the width of the groove was chosen to be 30 μm and the depth of the groove 50 μm. By using an excimer laser in this way, it is possible to make the groove 53 with a width of 10 μm or smaller. Furthermore, the depth of the groove 53 can be arbitrarily adjusted with the depth larger than the width. This capability of providing a large aspect ratio is one of the features of the intaglio 50.

When an excimer laser is employed for processing, any material which decomposes by photochemical reaction can be used as the flexible resin base material including such other materials as polyethylene terephthalate (PET) and polyetherimide (PEI). When the polyimide film used as the flexible resin base material, the intaglio 50 cannot be easily peeled from the conductive paste 52 filled in the groove 53. In order to avoid the conductive paste 52 remaining inside the groove 53 after the transference process, a peeling layer (not shown in the drawings) is formed on the surface of the intaglio 50, especially on the surface of the groove 53. A monomolecular film of carbon fluoride is used as the peeling layer.

Subsequently, a silver paste as the conductive paste 52 is coated on the surface of the intaglio 50 on which the peeling layer has been formed. By wiping the coated surface of the intaglio 50 with a squeegee, extra silver paste on the intaglio surface was removed and at the same time the groove 53 could be thoroughly filled with the silver paste. The filled paste was dried in a drier together with the intaglio 50 to evaporate the organic solvent contained in the silver paste. During this process, volume of the silver paste filled in the groove 53 decreases by an amount equal to the evaporated amount of the organic solvent. In order to complement this volume reduction, processes of filling silver paste and drying is repeated again. Through this repetition, the thickness of the silver paste after drying can be made approximately equal to the depth of the groove 53. In this embodiment, filling and drying were repeated three times.

Figure 3:
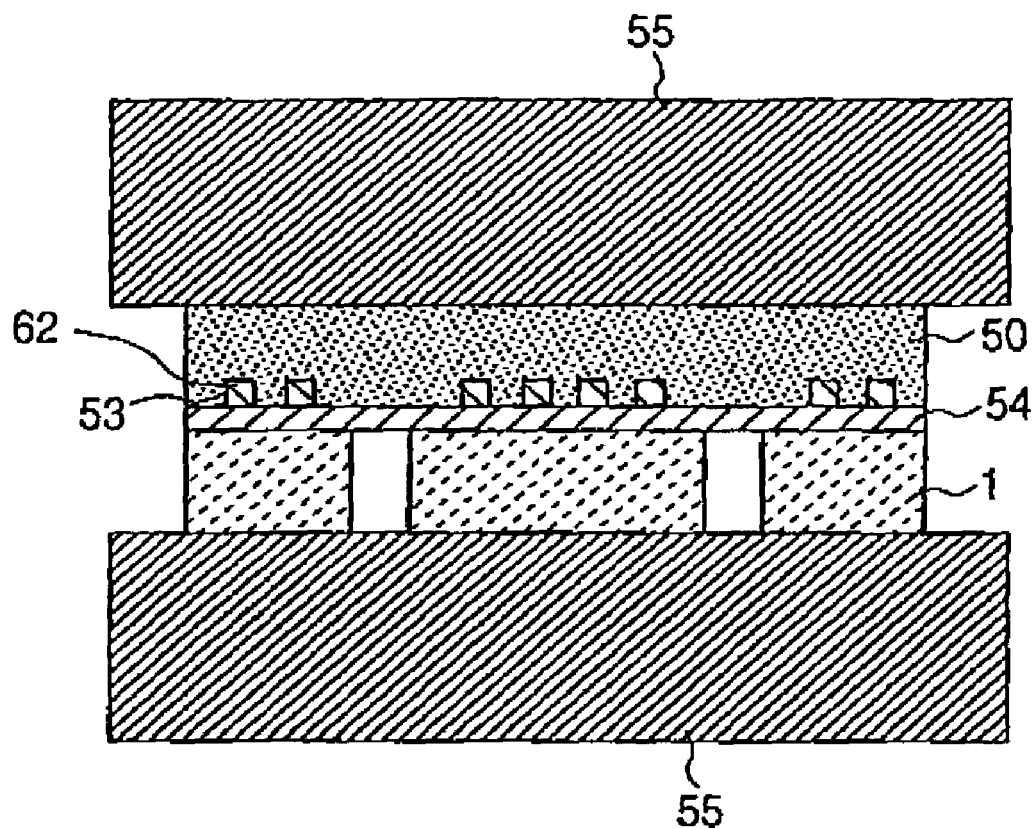
FIG. 3 is a schematic diagram showing the laminating process of the intaglio of the packaging substrate and a circuit substrate.

Next, to transfer the conductor pattern on the circuit substrate 1, an adhesive layer 54 composed of a thermoplastic resin is provided between the surface of the flexible substrate having intaglio and the circuit substrate 1. As schematically illustrated in FIG. 3, the side of the intaglio 50 having the groove 53 filled with dried conductive paste 62 is facing the adhesive layer 54. Then the intaglio 50 and the circuit substrate 1 are put together by applying heat and pressure. Here, a fired ceramic substrate was used as the circuit substrate 1. As will be set forth later, as the thickness of the adhesive layer increases, the conductor pattern cannot be properly formed due to the combustion of the adhesive layer 54 itself and the shrinking force during firing. It has been confirmed by experiments that a thickness of the adhesive layer 54 of 20 μm or smaller is appropriate. The temperature of putting together was chosen to be 130° C. This temperature was determined based on the finding that a good transferability could be obtained at a temperature approximately 30° C. higher than the glass transition temperature of the thermoplastic resin employed. The thermoplastic resin was prepared by dip-coating on the surface of the circuit substrate 1 a solution of butylcarbitol acetate (BCA) dissolved with polyvynilbutyral (PVB) and drying. Through this process, a PVB layer with a thickness of 5 μm can be formed on the entire surface of the circuit substrate as an adhesive layer 54. In addition to the dip-coating method, spinner method, roll-coater method, or screen printing method can also be employed for coating a PVB layer.

In the meantime, there usually exists on the surface of a circuit substrate 1 waviness with a magnitude of at least approximately 30 μm. When, an intaglio is made of an inflexible material such as glass, because its hardness and rigidity are too high, it cannot fully follow the waviness of the substrate at the time of putting together. An implementation based on the use of a flexible resin for the intaglio as in the present invention can fully cope with the wavy configuration of the substrate and provides a manufacturing method with a superior transferability.

Figure 4:
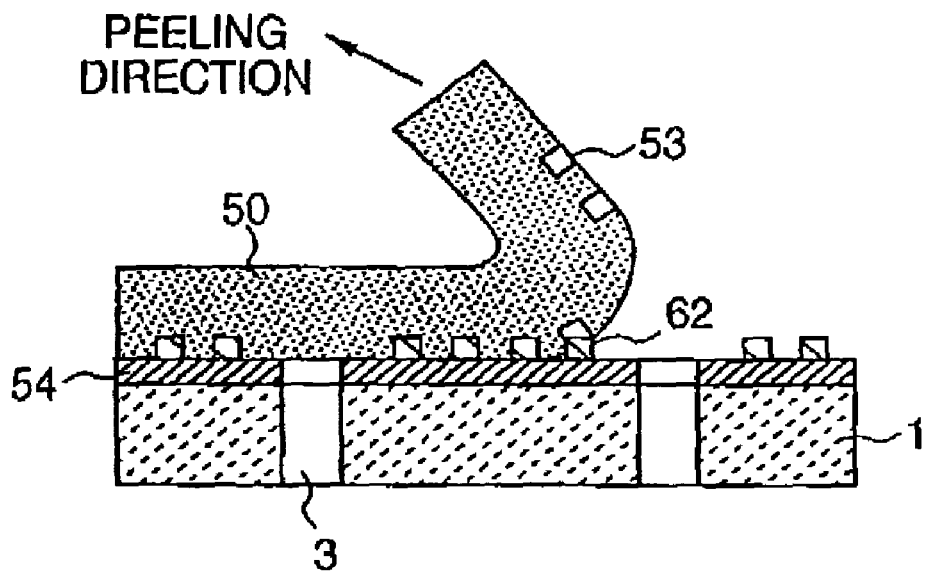
FIG. 4 is a schematic diagram showing transference process of the packaging substrate.
Figure 5:
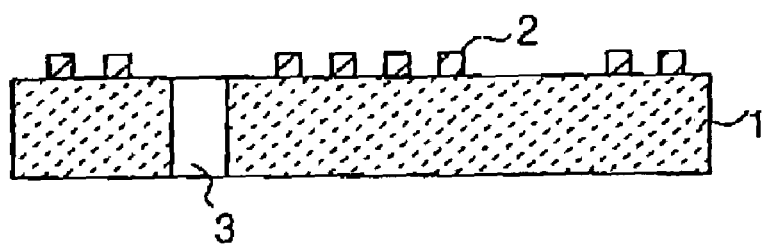
FIG. 5 is a schematic diagram showing the firing process of a conductor pattern of the packaging substrate.

Next, as the transference process, the intaglio 50 is peeled from the circuit substrate 1 after decreasing the temperature of the intaglio 50 to room temperature and the circuit substrate 1 which have been put together, and the dried conductive paste 62, being the first conductor pattern configured to the wiring pattern, is transferred. In doing this, it is possible to bend the intaglio 50 to an angle greater than 90° as shown in FIG. 4 because of the flexibility of the intaglio 50. As a result, since the peeling of the intaglio 50 from the circuit substrate 1 is along the lines, the force required for peeling is reduced making it easy to peel the intaglio 50.

Subsequently, the circuit substrate 1 on which the dried conductive paste 62 has been transferred as described above is fired under a temperature profile having a peak at 850°. As the circuit substrate 1 to be fired has a construction in which the conductor pattern has been formed via the adhesive layer 54, depending on the firing conditions, vigorous combustion gas may evolve from the adhesive layer 54 causing peeling or deformation of the conductor pattern, which will result in a defect. In order to avoid such trouble, it is desirable to maintain the temperature gradient at 200° C./hour or below in the temperature range 200° C. to 500° C. which corresponds to the temperature range from the start of firing of the adhesive layer 54 to the end.

After studying the relationship between the temperature conditions and the thickness of the adhesive layer, it has been confirmed that, when the thickness of the adhesive layer is smaller than 20 μm, there is no deformation of the conductor pattern or peeling of the conductor pattern during firing under the above temperature conditions. Based on the above process, the first conductor pattern 2 was formed with a minimum line width of 30 μm, a minimum line spacing of 60 μm, and a conductor thickness of 30 μm after firing. The electrical resistance of the first conductor pattern was 0.2Ω at the longest line-length part. Also the area resistance $R_s$ of the conductor was 0.7 mΩ (area resistance $R_s = \rho \times L/S$ (ρ: resistivity L: length of wiring S: cross section area of wiring) which are very low as a wiring resistance.

Next, in forming the electrode inside through hole 32, a conductive paste is sucked into the through hole by air suction force from both the side of the first conductor pattern 2 and the second conductor pattern 12, thereby coating the through hole with the conductive paste, followed by drying and firing. Here, the conductive paste used was Ag—Pd paste, which is the same as that used in the second conductor pattern to be set forth later. The peak firing temperature was 850° C.

Formation of the second conductor pattern 12 will now be described. In this case, as the required line width or line spacing of the second conductor pattern is not needed to be particularly fine, a conventional screen printing method was employed. However, when a fine pattern is required for the second conductor 12, too, it can be formed by exactly the same method as that of the first conductor pattern 2 as described in this embodiment. Here, the same Ag—Pd paste as used in the electrode 32 inside the through hole was used as the conductive paste.

Next, for the formation of the first ball-shaped solder 4, 0.5 mm diameter spheres of a high-melting-point solder having a composition of Pb (90%) and Sn (10%) are prepared and are appended in line on the certain point of the second conductor pattern 12 of which the locations for appending the solder balls have been coated with a flux in advance. The appended solder balls are melted in a reflow furnace at 340° C. in a nitrogen atmosphere and joined to the second conductor pattern as shown in FIG. 1(b) thereby producing a complete packaging substrate.

Further the conductor patterns can be applied with non-electrolytic Ni—Au metal plating for protection of the conductors. Although a flux was coated on the second conductor pattern 12 for the purpose of joining to the first ball-shaped solder 4, it is also possible to coat an eutectic solder (Pb 64%:Sn 36%) by screen printing and appending on the eutectic solder the ball-shaped solder and joining it in a reflow furnace at 240° C. Furthermore, instead of the flexible resin base material of the intaglio used here, a metallic base material can also be used for the intaglio.

According to the present embodiment a large conductor thickness, for example 30 μm, can be realized for a line width of 30 μm, thereby providing a very low wiring resistance and suggesting possibility of making all or most or the wiring on a single layer even in the case of a large multiple-pin packaging substrate.

As the conductor pattern is formed on a ceramic substrate which is already sintered, it is possible to control the precision of the land pattern for connection with an LSI chip with a dispersion of an order of several μm, and to achieve an yield of almost 100% in face-down mounting of LSI chips.

Since the line width of wiring pattern can be made as fine as 10 μm, further size reduction may be possible by employing a multi layer configuration. Also mounting of multiple LSI chips on one circuit substrate may become possible.

Since the wiring pattern can be formed on a single layer, it becomes possible to eliminate noise by simple construction of covering the pattern with a dielectric material thereby obtaining an electrically stable packaging substrate.

Second Embodiment

Figure 6:
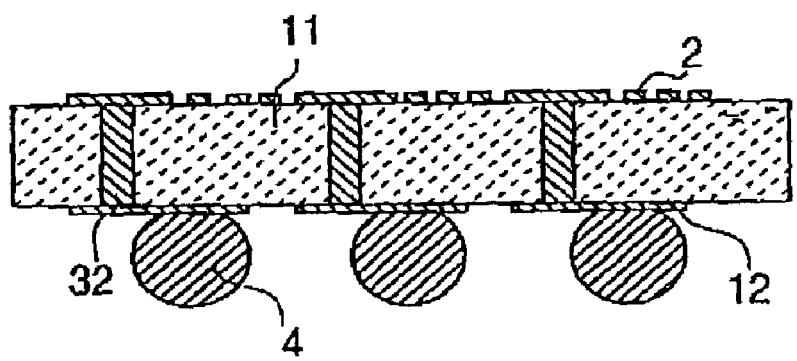
FIG. 6 is a partial cross section of a packaging substrate in accordance with the second embodiment of the present invention.
Figure 7:
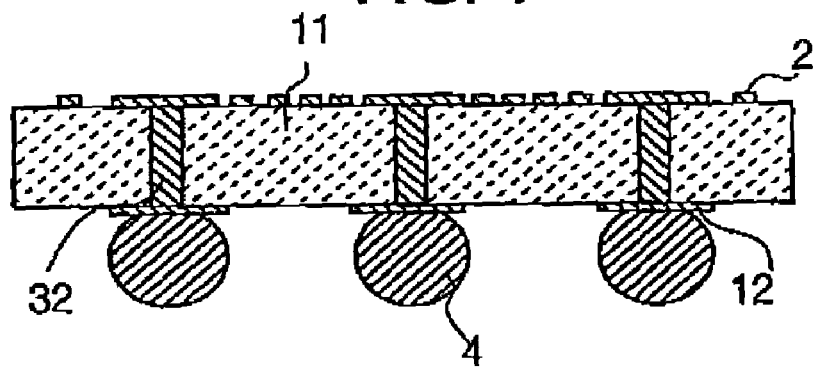
FIG. 7 is a partial cross section showing another configuration of the packaging substrate.

Referring to FIG. 6 and FIG. 7, a second embodiment of the manufacturing method of packaging substrate in accordance with the present invention is explained in the following. FIG. 6 and FIG. 7 show partial cross sections of the present embodiment. In this embodiment, a green sheet is used to form, the circuit substrate.

A green sheet is formed by a slurry which is a mixture of powder, such as glass powder or Al powder and the like, and a binder in a sheet form. A binder here is liquid resin or solution of resin powder in a solvent.

In this embodiment, a green sheet containing glass ceramic material which can be sintered at a low temperature is used as an unsintered green sheet. Holes are punched on the green sheet at predetermined positions for formation of through holes, followed by filling Ag—Pd paste as a conductive paste in the through holes by screen printing, and drying to form electrode 32 inside the through holes.

Next, the side of the green sheet on which the first conductor pattern 2 is to be formed was coated with a solution of BCA dissolved with PVB using a roll coater, and then dried. On the other hand, the filling of a conductive paste onto an intaglio and drying were performed in the same manner as in the first embodiment. The green sheet was cut to predetermined dimensions and laminated with the intaglio in the same manner as in the first embodiment, the conductor pattern was transferred, and a first conductor pattern 2 was obtained on the green sheet.

A second conductor pattern 12 was formed by screen printing Ag—Pd paste, followed by firing of the green sheet together with the second conductor pattern under a temperature profile having a peak temperature at 900° C. As a result of firing, the green sheet shrank by about 15% and a ceramic substrate 11 was obtained. The groove pattern of the intaglio had been designed with an allowance in anticipation of the shrinkage.

Next, a first ball-shaped solder 4 was formed in exactly the same way as in the first embodiment, and a packaging substrate was completed.

In this embodiment, as the inside of through holes is totally filled with Ag—Pd, it is also possible to connect the first ball-shaped solder 4 directly underneath the electrodes 32 inside the through holes as shown in FIG. 7. Here, although a glass ceramic based material which can be fired at a low temperature was used as an unfired green sheet, it is also possible to use an alumina based material for high temperature firing, in which case tungsten paste is to be used as the conductive material, a mixture of nitrogen and hydrogen as the firing atmosphere, and firing is to be made at a peak temperature in the range 1,500° C. to 1,600° C. Furthermore, instead of coating on the surface of the green sheet where the first conductor pattern is to be formed a solution of BCA dissolved with PVB as done here, the binder of the green sheet can also be utilized to place the first conductor pattern on the green sheet.

In this embodiment, too, as it is possible to form a fine and thick conductor pattern by intaglio printing, the wiring resistance is extremely low, suggesting possibility of forming all or most of the wiring on a single layer even in the case of a large, multiple-pin packaging substrate.

Third Embodiment

Figure 8:
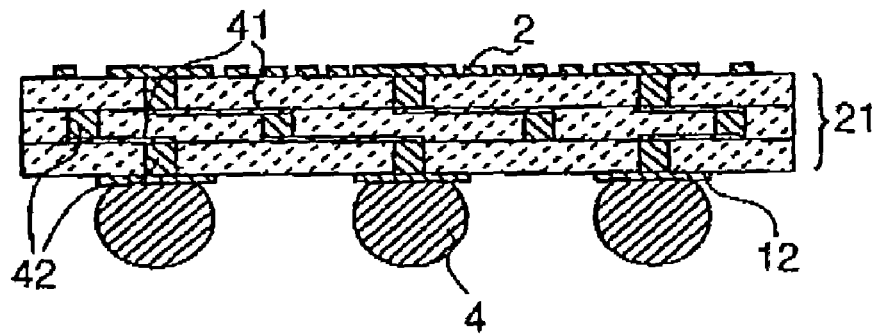
FIG. 8 is a partial cross section showing a packaging substrate in accordance with the third embodiment of the present invention.

A third embodiment of the manufacturing method of a packaging substrate according to the present invention will be explained in the following referring to FIG. 8. First, formation of a multilayer circuit substrate shown in FIG. 8 will be explained. A multilayer circuit substrate 21 consisting of a lamination of 3 substrates is shown as an example. To make individual substrates, green sheets containing glass ceramic with a low sintering temperature were prepared as in the second embodiment. Holes were punched on these green sheets at predetermined positions to make via holes, which were then filled with a conductive Ag—Pd paste by screen printing. The green sheets were then dried and the electrodes 42 inside via holes were formed.

Next, in order to form internal wiring electrode 41 on one side or both sides of a green sheet, patterns were formed by screen printing Ag—Pd paste. By heating under pressure a stack of 3 green sheets, a laminated multilayer-wired green sheet was obtained.

A first conductor pattern 2 was then formed on the laminated green sheet by transference with an intaglio as in the second embodiment, a second conductor pattern 12 was formed by screen printing, and the circuit substrate and the second conductor thereon is fired at 900° C.

A first ball-shaped solder 4 was then formed in the same manner as in the first and second embodiments and a complete packaging substrate was obtained.

In this embodiment, although a glass ceramic based material which can be fired at a low temperature was used for the green sheet, it goes without saying that an alumina based material for high temperature firing can also be used. In that case, tungsten paste is to be used as the wiring material for the multilayer wiring substrate, a mixture of nitrogen and hydrogen is to be used as the firing atmosphere, and firing is to be made at a peak temperature in the range 1,500° C. to 1,600° C. Additionally, the first and second conductor patterns can be formed by intaglio printing and screen printing on the surface using a copper paste after a sintered multilayer-wired packaging substrate 21 has been obtained, and by firing the assembly in a nitrogen atmosphere at a peak temperature of 850° C., thus obtaining a complete packaging substrate.

In this embodiment, too, as it is possible to form fine and thick conductor patterns by intaglio printing, the obtained wiring resistance is extremely low. In addition, since multilayer wiring is also possible, this method of manufacturing is effective in miniaturizing packaging substrate especially when two or more LSI chips are to be mounted and wiring crosses each other.

Fourth Embodiment

Referring to FIG. 1(b), a fourth embodiment of the manufacturing method of a packaging substrate in accordance with the present invention will be explained in the following.

In FIG. 1(b), the required surface condition of the circuit substrate 1 is different on the side on which a first conductor pattern 2 is to be formed and on the side on which a second conductor pattern 12 is to be formed because the purposes of the surfaces are different. In order to allow formation of a fine pattern and a low wiring resistance, surface roughness of the side of the circuit substrate 1 on which the first conductor pattern is to be formed is the smaller the better. On the other hand, the side on which the second conductor pattern 12 is to be formed should have surface condition to assure a bonding strength large enough to withstand the pulling force applied to the first ball-shaped solder 4 joined to the second conductor pattern 12. In order to increase the bonding strength, it is necessary to make large the surface roughness of the circuit substrate as a means of strengthening the chemical and physical bond between the second conductor pattern and the circuit substrate.

In an effort to simultaneously solve two conflicting requirements on the circuit substrate 1, the inventors tried to make the particle size of alumina powders composing the circuit substrate finer to make the surface smoother. On the other hand, one side of the circuit substrate, green sheet, is made rough during the process of making a circuit substrate in a sheet form, the surface of the other side of the circuit substrate was made rough by coating slurry on a film having a surface roughness greater than Ra=0.1 μm.

As a result, a surface roughness of Ra=0.20 μm was obtained on the surface of the circuit substrate on which the first conductor pattern 2 is to be formed, and Ra=0.55 μm on the surface on which the second conductor pattern is to be formed, thereby greatly improving the bonding strength between the second conductor pattern and the circuit substrate from 1.9 kg/mm$^2$ to 3.1 kg/mm$^2$. In association with this, the bonding strength of the first ball-shaped solder has also been greatly improved at the same time.

The process of manufacturing packaging substrate such as the formation of the conductor patterns and the first ball-shaped solder is the same as in the first embodiment and yet the quality obtained was further improved over that of the first embodiment.

Fifth Embodiment

Figure 9:
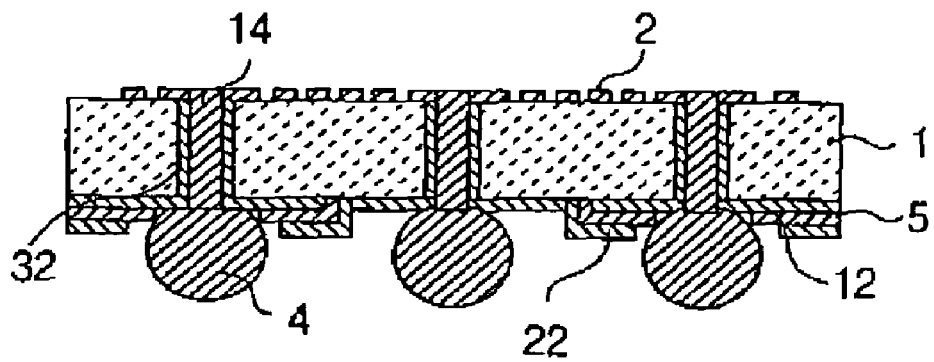
FIG. 9 is a partial cross section of a packaging substrate in accordance with the fifth embodiment of the present invention.

Referring to FIG. 9, the fifth embodiment of the method of manufacturing packaging substrate in accordance with the present invention will be explained in the following. First, a first conductor pattern 2, electrode inside through hole 32, and a second conductor pattern 12 were formed by the same processes as employed in the first embodiment.

Next, a dielectric layer 5 was formed by screen printing a dielectric paste on top of the second conductor pattern 12 and fired at a peak temperature of 900° C. The thickness of the dielectric layer after firing was chosen to be 40 μm. A dielectric material having a specific dielectric constant of 10,000 was used.

Next, using the same Ag—Pd paste as used for the second conductor pattern, a third conductor pattern 22 was formed by printing and fired at a peak temperature of 850° C. As a result, a capacitor has been formed between the second conductor pattern 12 and the third conductor pattern 22 with a capacitance of 2 μF.

Figure 10A:
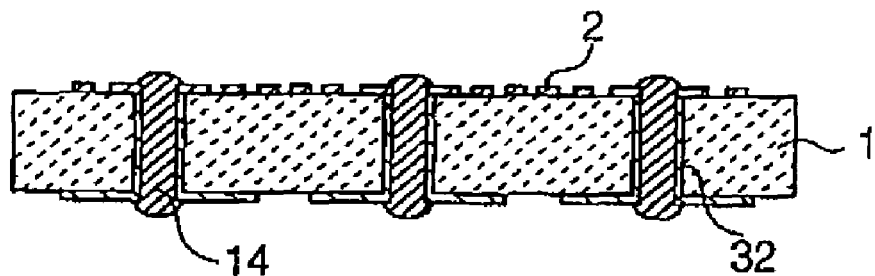
FIG. 10 (*a*) is a partial cross section of the packaging substrate during the process of filling a second solder.
Figure 10B:
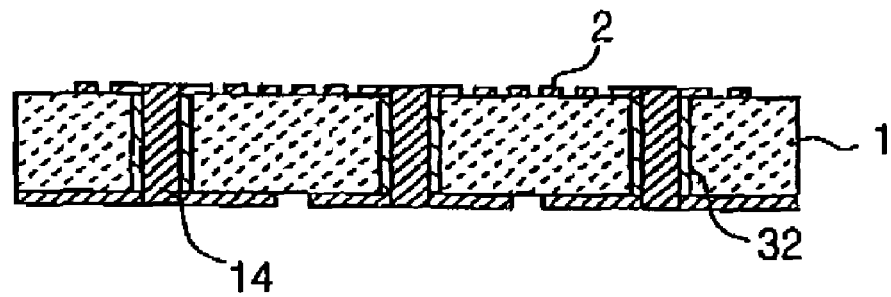

Next, although the electrode is formed in the through hole 32 of the circuit substrate 1, there is an empty space left. In order to fill the empty space, a high-melting-point solder paste (Pb 90%:Sn 10%) was filled by screen printing. FIG. 10(a) is a schematic representation of the state of the second solder 14 after the solder paste has been filled in the empty space of the through hole and reflown. As shown in FIG. 10(a), in order to fill the empty space so that more solder can be produced than enough, it is important to make the thickness of the paste larger on the side of printing, and to allow the solder to flow into the through hole during reflow by wetting of the electrode inside the through hole.

Also, in order to make the dispersion in quantity of the second solder 14 uniform, the portions of the second solder bulging above the surface of electrode on the circuit substrate 1 is cut with a sharp knife edge, and the height of the second solder was made uniform as shown in FIG. 1(b). The first ball-shaped solder 4 is then formed in the same manner as the first embodiment, thus completing a packaging substrate.

As the packaging substrate of the present embodiment has a wiring pattern covered with a dielectric, noise reduction can be achieved by a simple construction utilizing its capacitance, thereby providing a packaging substrate having a high electrical performance. Furthermore, since solder is filled in the empty space of the through hole of the circuit substrate, the bonding strength between the solder balls and the circuit substrate is strong and, as a result, the mechanical strength reliability of the solder balls is high. Also, as the thermal conductivity of solder is high, the heat generated by LSI can be efficiently transferred to the solder balls. As the solder filled in the through holes is uniform in height, the first ball-shaped solder to be mounted thereon will have a minimal dispersion in height.

Sixth Embodiment

Figure 11:
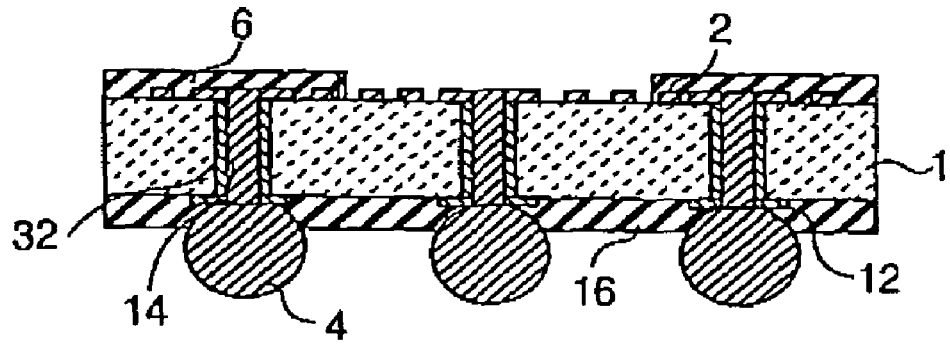
FIG. 11 is a partial cross section of a packaging substrate in accordance with the sixth embodiment of the present invention.
Figure 12:
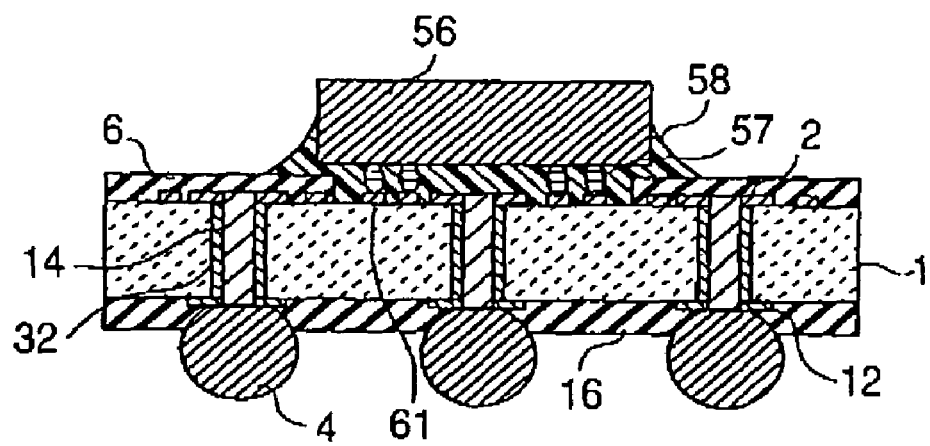
FIG. 12 is a partial cross section of the packaging substrate after mounting of an LSI chip.

Referring to FIG. 11 and FIG. 12, the sixth embodiment of the method of manufacturing a packaging substrate in accordance with the present invention will be explained in the following.

Starting from the formation of the first conductor pattern 2, the same processes as employed in the first embodiment were employed up to the process of formation of the electrode inside through hole 32 and the formation of the second conductor pattern 12.

Next, a first insulating layer 6 and a second insulating layer 16 were formed by screen printing crystallized glass paste on top of the first and second conductor patterns, and were simultaneously fired at a peak temperature of 850° C. The thermal expansion coefficient (a) of the crystallized glass paste used here was $7.8\times10^{-6}/°$ C. The a value of the alumina based circuit substrate 1 was $7.2\times10^{-6}/°$ C.

It is noted that the first insulating layer 6 and the second insulating layer 16 have a thermal expansion coefficient +/−10% of the thermal expansion coefficient of the circuit substrate. In addition, the first insulating layer 6 and the second insulating layer 16 can be formed simultaneously.

Next, using a high-melting-point solder paste (Pb 90%:Sn 10%), a second solder 14 is formed in the through holes of the circuit substrate in the same manner as in the fifth embodiment. A first ball-shaped solder 4 was then joined to the second solder 14 and the second conductor pattern 12 using spheres of high-melting-point solder (Pb 90%:Sn 10%), 0.5 mm in diameter, in the same manner as in the first embodiment, thus obtaining a packaging substrate.

Subsequently, in mounting an LSI chip having bumps onto the above-mentioned packaging substrate as shown in FIG. 12, eutectic solder (Pb 64%:Sn 36%) was used as the bumps. Also, the bumps 57 had been coated with a flux prior to mounting. An LSI chip 56 having bumps is placed on the land portion 61 of the first conductor pattern 2 on the circuit substrate with the position precisely aligned. The packaging substrate and the LSI chip were joined quietly to avoid dislocation by melting the bumps at 260° C. in a reflow furnace. After joining is finished, the flux was cleansed to keep the interface between the LSI chip and the substrate clean.

Next, in order to protect the LSI chip 56 and the first conductor pattern 2, a sealing resin 58 was filled in between them and cured at 180° C., thus completing an LSI-mounted packaging substrate. The sealing resin used here was epoxy resin blended with fine inorganic powders.

Here, a material having an a value of $7.8\times10^{-6}/°$ C. was used as the crystallized glass paste. When a material with $a=9.0\times10^{-6}/°$ C. is used, microcracks may be caused in the first insulating layer 6 and the second insulating layer 16 due to rapid heating and cooling during the formation of the first and second solders because of the difference in a between the paste and the circuit substrate 1.

When the first insulation layer 6 is formed but the second insulating layer 16 is not formed, even though the difference in a between the insulating layer and the substrate is very small, warping of the packaging substrate after firing becomes large. In other words, as the dispersion of the height of the land portion 61 becomes large, mounting defects tend to occur because some of the bumps 57 may not reach the land portion when mounting an LSI chip 56. In order to avoid this situation, the first insulating layer 6 and the second insulating layer 16 are formed simultaneously and their a was chosen to be within +/−10% of that of the packaging substrate.

As a result, a packaging substrate has been obtained with a high yield of mounting even in the case of a fine wiring pattern and in which migration does not tend to occur even when using Ag as the conductive material as the wiring pattern is covered with an insulating layer.

In this embodiment, an LSI chip was mounted after the first ball-shaped solder 4 had been joined to the second solder 14 and the second conductor pattern 12. As an alternative, the first ball-shaped solder can be joined after mounting an LSI. In this case, it is preferable to use eutectic solder as the first ball-shaped solder 4. Instead of using the first ball-shaped solder 4, one can print solder paste in advance on the printed circuit board on which a packaged substrate is to be mounted, place the substrate, and join them in a reflow furnace.

Seventh Embodiment

Figure 13:
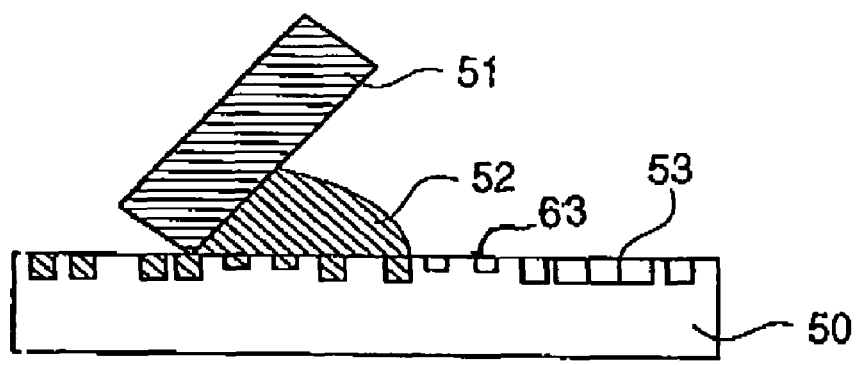
FIG. 13 is a schematic diagram showing the process of filling conductive paste onto an intaglio in the seventh embodiment of the present invention.
Figure 14:
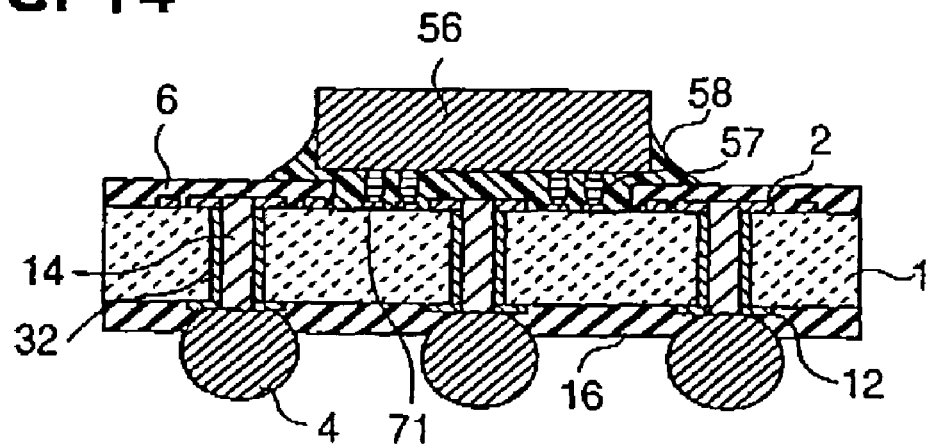
FIG. 14 is a partial cross section of the packaging substrate after mounting of an LSI chip.

Referring to FIG. 13 and FIG. 14, a seventh embodiment of the manufacturing method of packaging substrate in accordance with the present invention will be explained in the following. First, on the intaglio for forming the first conductor pattern 2, a groove 53 is formed on polyimide film used as a flexible resin base material as is explained in the aforementioned embodiments. Here, a shallow groove 63 is made on a portion of the pattern (the land portion in this embodiment). To be more specific, using an excimer laser, a groove 53 was formed to a depth of 50 μm while a shallow groove 63 was formed to a depth of 20 μm.

The package shown in FIG. 14 was fabricated by the same process as the sixth embodiment including the process of filling a conductive paste onto an intaglio 50 and drying, and transferring a second conductor pattern 2 onto a circuit substrate 1, the process of forming an electrode inside through holes 32 and a second conductor pattern 12, the process of forming first and second insulating layers 6, 16, and first and second solders 4, 14, through mounting of an LSI chip 56, but with the exception of the process of forming the first conductor pattern.

What is different from the sixth embodiment is a thin land portion 71 formed on the end portion of the first conductor pattern 2 as shown in FIG. 14. By making the thickness of the first conductor pattern at the land portion thin, it is possible to position an LSI chip on the land portion 71 with high precision and achieve a high yield of mounting without loosing placement stability of the LSI chip even when the distance between bumps 57 of the LSI chip gets smaller, or the bumps get smaller. To summarize, it has been confirmed that the land portion as shown in the seventh embodiment is furthermore effective in the mounting of an LSI with narrow pitch bumps.

Eighth Embodiment

Figure 15:
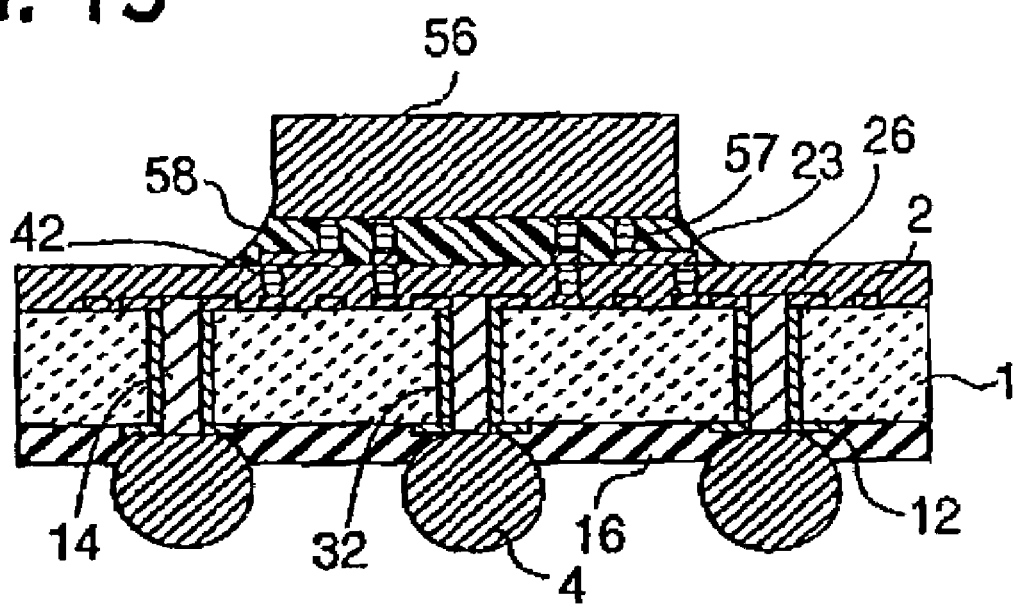
FIG. 15 is a partial cross section of a packaging substrate after mounting of an LSI chip in accordance with the eighth embodiment of the present invention.

Referring to FIG. 15, the eighth embodiment of the method of manufacturing a packaging substrate in accordance with the present invention will be explained in the following.

Starting from the formation of the first conductor pattern 2, the same processes as employed in the first embodiment were employed up to the process of formation of the electrode inside through hole 32 and the formation of the second conductor pattern 12.

Next, an unfired green sheet was used here as the insulating layer 26. The unfired green sheet was prepared by using the same inorganic component as the crystallized glass paste used in the sixth embodiment for the purpose of making the a values of the circuit substrate 1 and an insulating layer 16 substantially the same. The thickness of the green sheet was chosen to be 100 μm. Via holes were punched with a puncher and were filled with a conductive Ag—Pd paste by screen printing, and then dried. The green sheet thus obtained was positioned on a circuit substrate 1, laminated under heat and pressure, and fired at a peak temperature of 850° C.

Next, a second insulating layer 16 was formed by screen printing using the same material as in the sixth embodiment and fired. A fourth conductor pattern 23 was subsequently formed on top of the insulating layer 26 by intaglio printing using a Ag paste, and fired. A first solder 4 and a second solder 14 were formed and an LSI chip having bumps 56 was mounted in the same manner as in the sixth embodiment, and a packaging substrate shown in FIG. 15 was obtained.

When the number of electrode pads of the LSI chip 56 is very large as in the case of an area pad type, the wiring formed there for connection to the bumps becomes highly dense in an extremely narrow space. Under such a situation, the packaging substrate in accordance with the present embodiment is extremely effective in that the first conductor pattern 2 and the fourth conductor pattern 23 are formed by use of a fine and thick wiring pattern made by intaglio printing, and that the connection of the first conductor pattern 2 and the fourth conductor pattern 23 is done by means of the electrode inside via hole 42.

Ninth Embodiment

Referring to FIG. 16, the ninth embodiment of the method of manufacturing a packaging substrate in accordance with the present invention will be explained in the following.

Figure 16A:
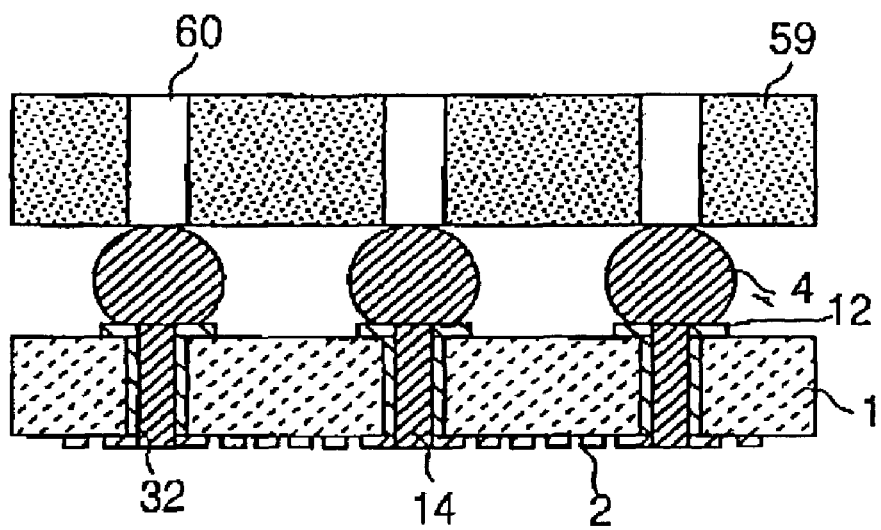
FIGS. 16(a), 16(b), 16(c) are diagrams showing the process of making a pillar-shaped solder in a packaging substrate in accordance with the ninth embodiment of the present invention.

Regarding this embodiment, an explanation will be made especially on the process of transforming the first ball-shaped solder 4 to a pillar-like shape. FIG. 16(a) shows a packaging substrate, which is substantially the same as in the foregoing embodiments, placed with the first ball-shaped solder 4 upward, and loaded with a casting plate 59 having holes 60 opposite the first ball-shaped solder 4. The casting plate 59 is made of alumina-based ceramic substrate. A ceramic substrate was used for the purpose of making the a value of the casting plate 59 approximately equal to that of the circuit substrate 1 so as to increase dimensional precision during the heating process to be described later.

Figure 16B:
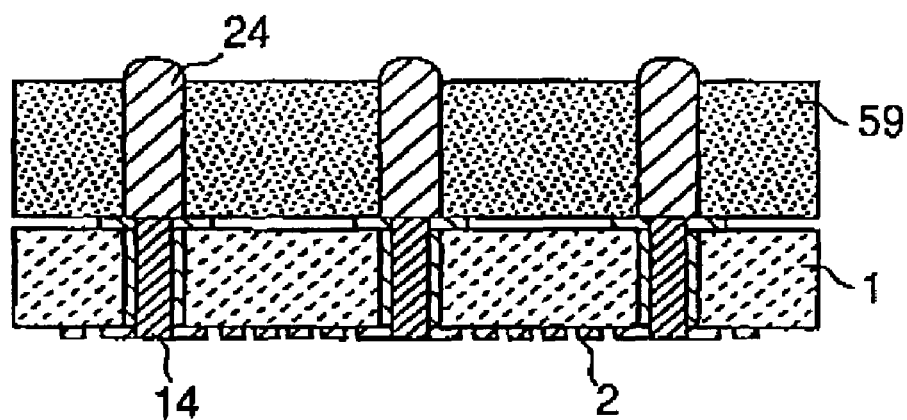
Figure 16C:
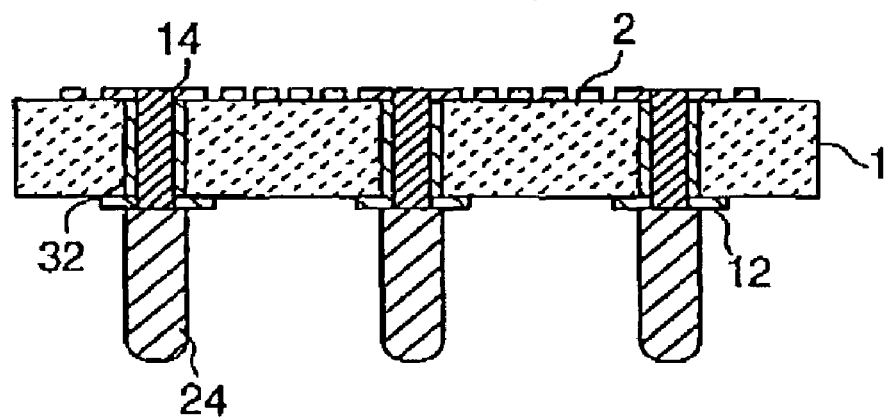

Next, the aforesaid casting plate 59 and the packaging substrate were heated in a reflow furnace to melt the first ball-shaped solder 4, and a pillar-shaped solder 24 as shown in FIG. 16(b) was obtained by transforming the first ball-shaped solder 4 to the same shape as the hole 60. By removing the casting plate 59 after cooling, a packaging substrate as shown in FIG. 16(c) was obtained which has the first pillar-shaped solder 24. In this embodiment, the material used in the first ball-shaped solder was eutectic solder (Pb 64%:Sn 36%) while a high-melting-point solder (Pb 90%:Sn 10%) was used in the second solder 14.

With the packaging substrate having pillar-shaped solder as fabricated by the present embodiment, it has become possible to withstand heat cycle tests even when the packaging substrate is mounted on a glass epoxy circuit board up to a relatively large size of which the α value differs greatly from that of the packaging substrate. The reason is because, with the pillar-shaped solder, the height can be made higher than that of the ball-shaped solder, and thus larger allowance of solder deformation is available to cope with the stress and strain arising from the difference in the α values between glass epoxy circuit board and ceramic circuit substrate, thereby minimizing the fatigue of the solder.

Although a ceramic substrate was used in the casting plate 59, when there is no necessity to secure high dimensional precision, one can use a metallic plate such as stainless steel or thermosetting resin plate. In case the first pillar-shaped solder 24 shown in FIG. 16(b) greatly protrudes from the casting plate, it is useful to cut the protruding portions with a sharp knife edge and make the height of the pillar-shaped solder uniform.

Tenth Embodiment

Referring to FIG. 17, the tenth embodiment of the method of manufacturing a packaging substrate in accordance with the present invention will be explained in the following. Regarding this embodiment, the method of forming pillar-shaped solder corresponding to the first ball-shaped solder 4 will be explained.

Figure 17A:
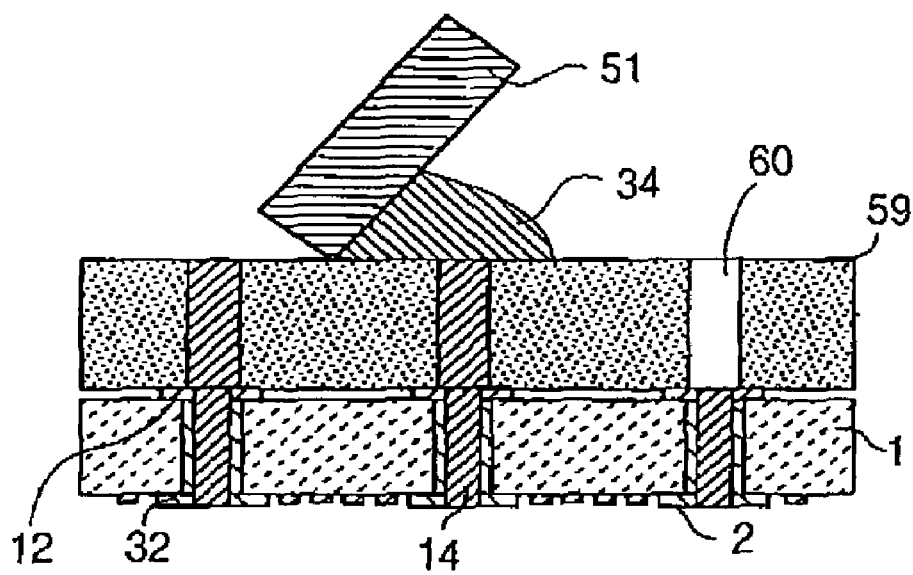
FIGS. 17(a), 17(b), 17(c) are diagrams showing the process of making a pillar-shaped solder in a packaging substrate in accordance with the tenth embodiment of the present invention.

FIG. 17(a) shows a packaging substrate, which is substantially the same as in the aforementioned embodiments, placed with the second conductor pattern 12 upward, and loaded with a casting plate 59 having holes 60 opposite the second ball-shaped solder 14. A casting plate 59 made of stainless steel was used because, in filling solder paste into the holes of the casting plate 59 with a squeegee 51 as shown in FIG. 17(a), the wiping operation is smooth as the surface property of the casting plate 59 is superior.

Figure 17B:
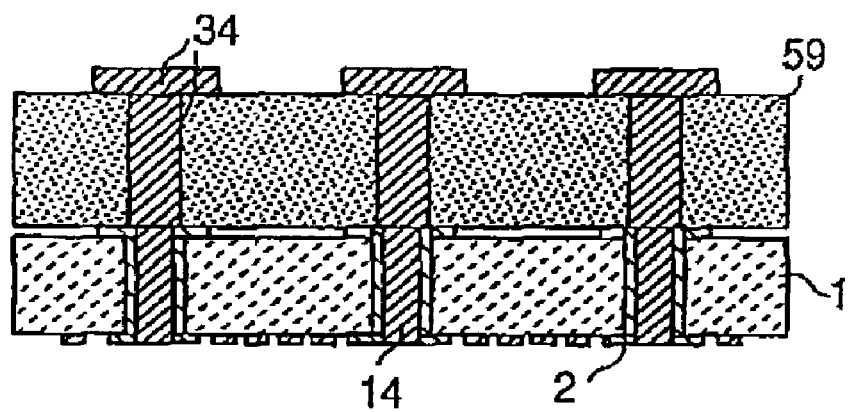
Figure 17C:
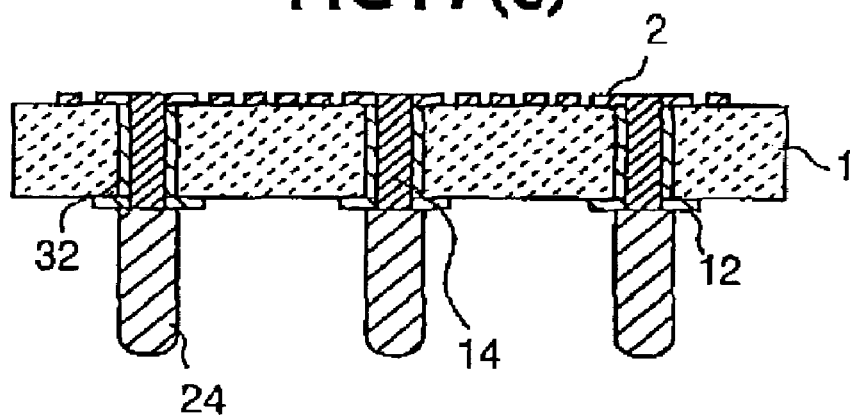
Figure 18:
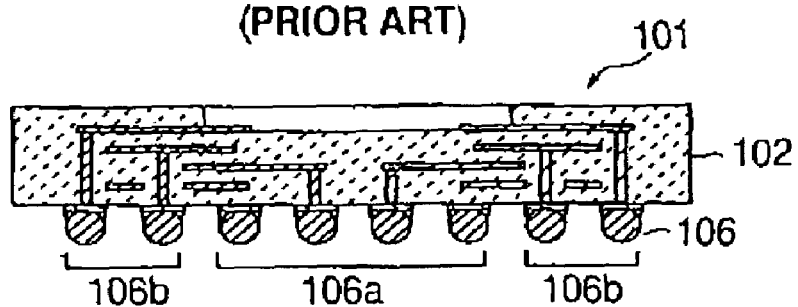
FIG. 18 is a schematic cross section showing a conventional packaging substrate.
Figure 19A:
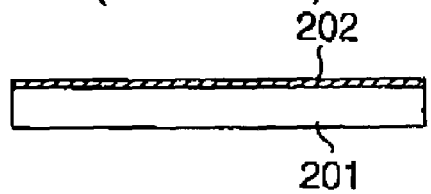
FIGS. 19(a) to 19(e) are diagrams showing the process of forming a conductor pattern in a conventional packaging substrate.
Figure 19B:
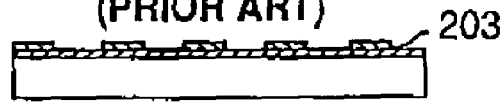
Figure 19C:
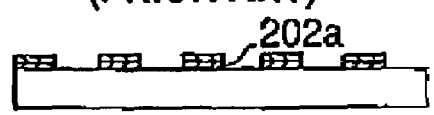
Figure 19D:
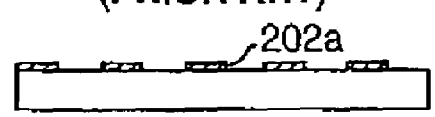
Figure 19E:

As shown in FIG. 17(b), solder paste 34 is further formed by screen printing on top of the casting plate 59. This is to supplement the reduction in volume, when molten, of the solder paste filled in the holes 60, which would otherwise cause insufficient height of solder. By means of the solder paste additionally printed on top of the casting plate 59, the holes 60 can be completely filled with solder, thereby making it possible to form the first pillar-shaped solder 24 with a sufficient height as shown in FIG. 17(c).

With the use of a packaging substrate having pillar-shaped solder as formed in accordance with the present embodiment, exactly the same effect as the ninth embodiment was obtained.

Although description of the present invention has been made on a ceramic type packaging substrate, the invention is equally conducive to ceramic type pin-grid array (C-PGA) in which pin terminals are provided instead of the first ball-shaped solder.

As has been described above, with the method of manufacturing of a packaging substrate in accordance with the present invention, it is possible to implement a hybrid integrated circuit which is low in wiring resistance, small in size, and superior in mountability, by forming conductor circuit pattern on a circuit substrate and forming solder balls as external terminals.

While the present invention has been described with specific references to a preferred embodiment. It is apparent that modifications to the components and process flow may be made without departing from the spirit and scope of the invention as set forth in the appended claims.

What is claimed is:

1. A circuit substrate comprising:
   a substrate including a first surface and a second surface opposite to the first surface;
   a first conductor pattern formed on the first surface;
   a second conductor pattern formed on the second surface;
   an external terminal formed on the second conductor pattern to mount the circuit substrate on a second substrate;
   a dielectric layer formed on the second conductor pattern and the second surface; and
   a third conductor pattern formed on the dielectric layer and the second surface, wherein
   the second surface has larger surface roughness than the first surface,
   the dielectric layer covers the edge of the second conductor pattern,
   the third conductor pattern covers the edge of the second conductor pattern through the dielectric layer, and
   the second conductor pattern, the dielectric layer and the third conductor pattern form a capacitor.

2. A circuit substrate according to claim 1, wherein the external terminal is a ball-shaped solder.

3. A circuit substrate according to claim 1, further comprising a through hole in the substrate connecting the first and second surface.

4. A circuit substrate according to claim 3, further comprising an electrode filled in the through hole.

5. A circuit substrate according to claim 4, wherein the external terminal is connected directly underneath the electrode.

6. A circuit substrate according to claim 3, further comprising an electrode formed along the through hole.

7. A circuit substrate according to claim 6, further comprising a solder filled in the through hole.

8. A circuit substrate according to claim 7, wherein the solder has a higher melting point than the external terminal.

9. A circuit substrate according to claim 1, further comprising an electrode filled in a through hole of the substrate,
   wherein the electrode connects the first conductor pattern with the second conductor pattern, and
   the second conductor pattern covers the electrode on the second surface and includes the same metal as the electrode.

* * * * *